United States Patent [19]
Oguri

[11] Patent Number: 5,357,154
[45] Date of Patent: * Oct. 18, 1994

[54] LEVEL CONVERTER CIRCUIT FOR CONVERTING ECL-LEVEL INPUT SIGNALS

[75] Inventor: Takashi Oguri, Tokyo, Japan

[73] Assignee: NEC Corporation, Tokyo, Japan

[ * ] Notice: The portion of the term of this patent subsequent to Dec. 19, 2010 has been disclaimed.

[21] Appl. No.: 960,814

[22] Filed: Oct. 14, 1992

[30] Foreign Application Priority Data

Oct. 15, 1991 [JP]  Japan ................................ 3-296169

[51] Int. Cl.5 .......................................... H03K 19/01
[52] U.S. Cl. .................................... 307/475; 307/446
[58] Field of Search ............... 307/443, 446, 451, 475, 307/570

[56] References Cited

U.S. PATENT DOCUMENTS

| | | |
|---|---|---|
| 4,730,132 | 3/1988 | Watanabe et al. ............... 307/475 X |
| 5,059,821 | 10/1991 | Murabayashi et al. ......... 307/446 X |
| 5,068,548 | 11/1991 | El Gamel ......................... 307/570 X |
| 5,138,199 | 8/1992 | Hirata et al. ..................... 307/446 X |
| 5,159,214 | 10/1992 | Okumura ............................. 307/446 |
| 5,254,887 | 10/1993 | Oguri ................................... 307/446 |

*Primary Examiner*—David R. Hudspeth
*Attorney, Agent, or Firm*—Leydig, Voit & Mayer

[57] ABSTRACT

A level converter circuit, in which a bipolar transistor for raising an output voltage is switched on or off by a logical-BiMIS construction, and a MIS transistor for falling the output voltage is also switched on or off by a logic circuit and a charge discharge means 50 so as to reduce a propagation delay time, to raise a driving ability, to prevent a steady state current and to reduce a dissipation current.

7 Claims, 9 Drawing Sheets

F I G. 7
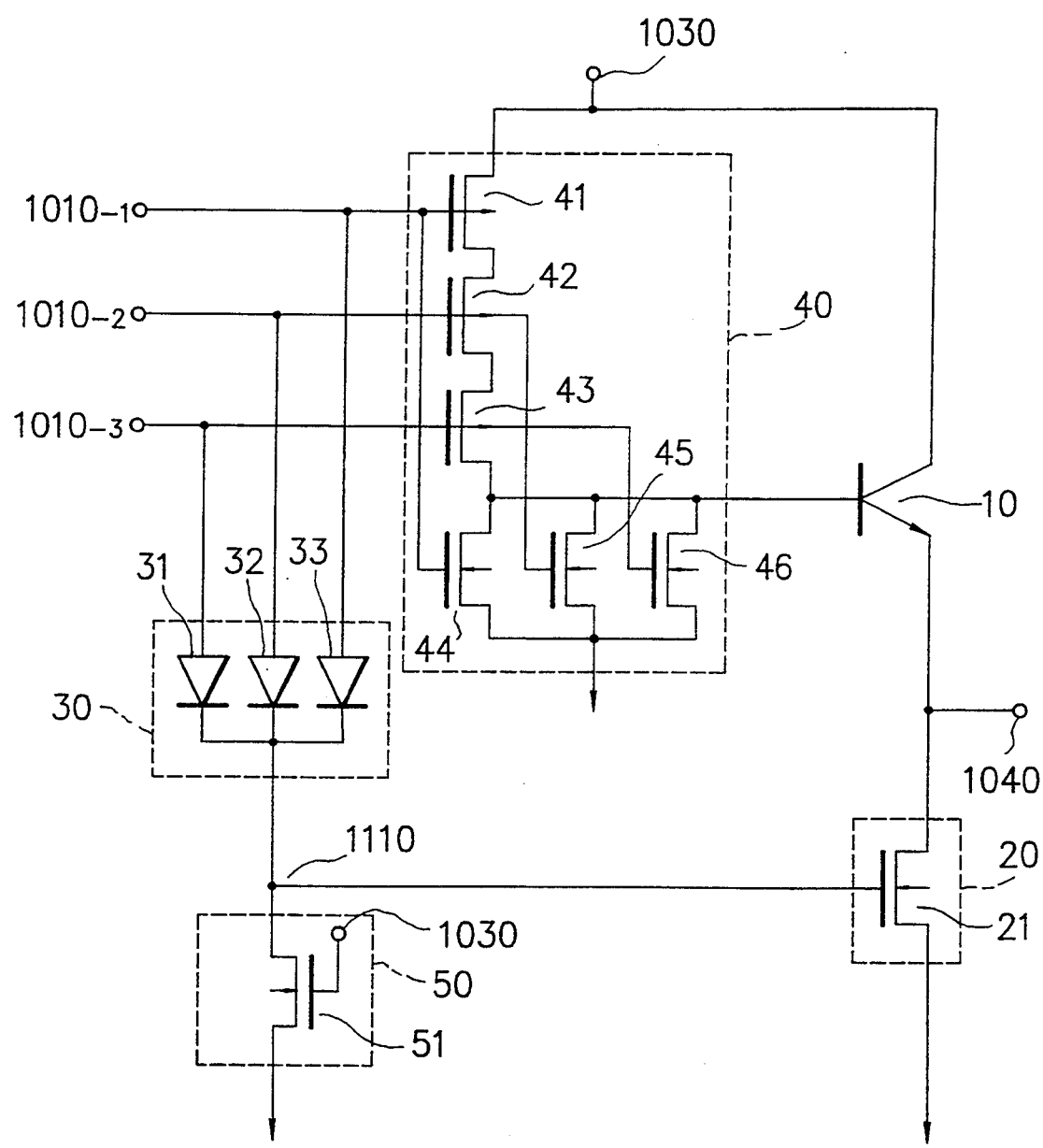

LEVEL CONVERTER CIRCUIT FOR CONVERTING ECL-LEVEL INPUT SIGNALS

BACKGROUND OF THE INVENTION

The present invention relates to a BiMIS device, and more particularly to a level converter circuit having a circuit for converting an ECL logical level into another logical level.

DESCRIPTION OF THE RELATED ARTS

Conventionally, as shown in FIG. 1, a level converter circuit of this kind includes an ECL (emitter coupled logic) circuit 1, a pair of emitter follower circuits 2a and 2b, a pair of level converter circuits 4a and 4b and a pair of BiMIS (bipolar metal insulator semiconductor) driver circuits 5a and 5b. In this case, the ECL circuit 1 includes two bipolar transistors 120 and 130 and two resistors 100 and 110 connected to collectors thereof and outputs an ECL logical level signal, and the emitter follower circuits 2a and 2b, each having a bipolar transistor 70, receive the output signal of the ECL circuit 1 and output signals 1080 and 1090. The level converter circuits 4a and 4b, each having four MIS (metal insulator semiconductor) transistors 160, 170, 180 and 190, receive the respective output signals 1080 and 1090 of the respective emitter follower circuits 2a and 2b and convert these signals into MIS or BiMIS logical levels. The BiMIS driver circuits 5a and 5b, each having three MIS transistors 200, 210 and 230 and one bipolar transistor 220, drive logic circuits of the following stage by the output signals of the level converter circuits 4a and 4b.

In this case, the output signals of the level converter circuits 4a and 4b have the logical amplitude of the MIS or BiMIS level, and the level converter circuits 4a and 4b are driven by the MIS transistors 180 and 190. Thus, when gates having a large load capacity are connected to the following stage of the level converter circuits 4a and 4b, a propagation delay time becomes large. Hence, the BiMIS driver circuits 5a and 5b as circuits for driving loads of the following stage are provided, and by the output signal 1070 of the BiMIS driver circuits 5a and 5b, the following loads are driven.

As described above, in the conventional level converter circuit, a four stage construction composed of the ECL circuit 1, the emitter follower circuits 2a and 2b, the level converter circuits 4a and 4b and the BiMIS driver circuits 5a and 5b is required, and the propagation delay time with respect to the input signal is very large. Further, since a steady state current flows in the level converter circuits 4a and 4b, a dissipation current is large.

SUMMARY OF THE INVENTION

It is therefore an object of the present invention to provide a level converter circuit in view of the aforementioned defects of the prior art, which is capable of reducing a propagation delay time with respect to an input signal and a dissipation current.

In accordance with one aspect of the present invention, there is provided a level converter circuit, comprising first bipolar transistor means having a collector and an emitter connected to a power source and an output terminal, respectively; first charge discharge means connected between the output terminal and a reference voltage; first logic circuit means for inputting at least two input signals and feeding an output to the first charge discharge means; second logic circuit means for inputting at least two input signals and the output of the first logic circuit means and feeding an output to a base of the first bipolar transistor means; and second charge discharge means connected between the first charge discharge means and the reference voltage.

In accordance with another aspect of the present invention, there is provided a level converter circuit, comprising first bipolar transistor means having a collector and an emitter connected to a power source and an output terminal, respectively; first charge discharge means connected between the output terminal and a reference voltage; first logic circuit means for inputting at least two input signals and feeding an output to the first charge discharge means; and second logic circuit means for inputting at least two input signals and the output of the first logic circuit means and feeding an output to a base of the first bipolar transistor means.

In accordance with a further aspect of the present invention, there is provided a level converter circuit, comprising first bipolar transistor means having a collector and an emitter connected to a power source and an output terminal, respectively; first charge discharge means connected between the output terminal and a reference voltage; first logic circuit means for inputting at least two input signals and feeding an output to the first charge discharge means; second logic circuit means for inputting at least two input signals and feeding an output to a base of the first bipolar transistor means; and second charge discharge means connected between the first charge discharge means and the reference voltage.

In accordance with still another aspect of the present invention, there is provided a level converter circuit, comprising first bipolar transistor means having a collector and an emitter connected to a power source and an output terminal, respectively; first charge discharge means connected between the output terminal and a reference voltage; first logic circuit means for inputting at least two input signals and feeding an output to the first charge discharge means; and second logic circuit means for inputting at least two input signals and feeding an output to a base of the first bipolar transistor means.

BRIEF DESCRIPTION OF THE DRAWINGS

The objects, features and advantages of the present invention will become more apparent from the consideration of the following detailed description, taken in conjunction with the accompanying drawings, in which:

FIG. 7 is a circuit diagram of a sixth embodiment of a level converter circuit according to the present invention;

DESCRIPTION OF THE PREFERRED EMBODIMENTS

Figure 2:
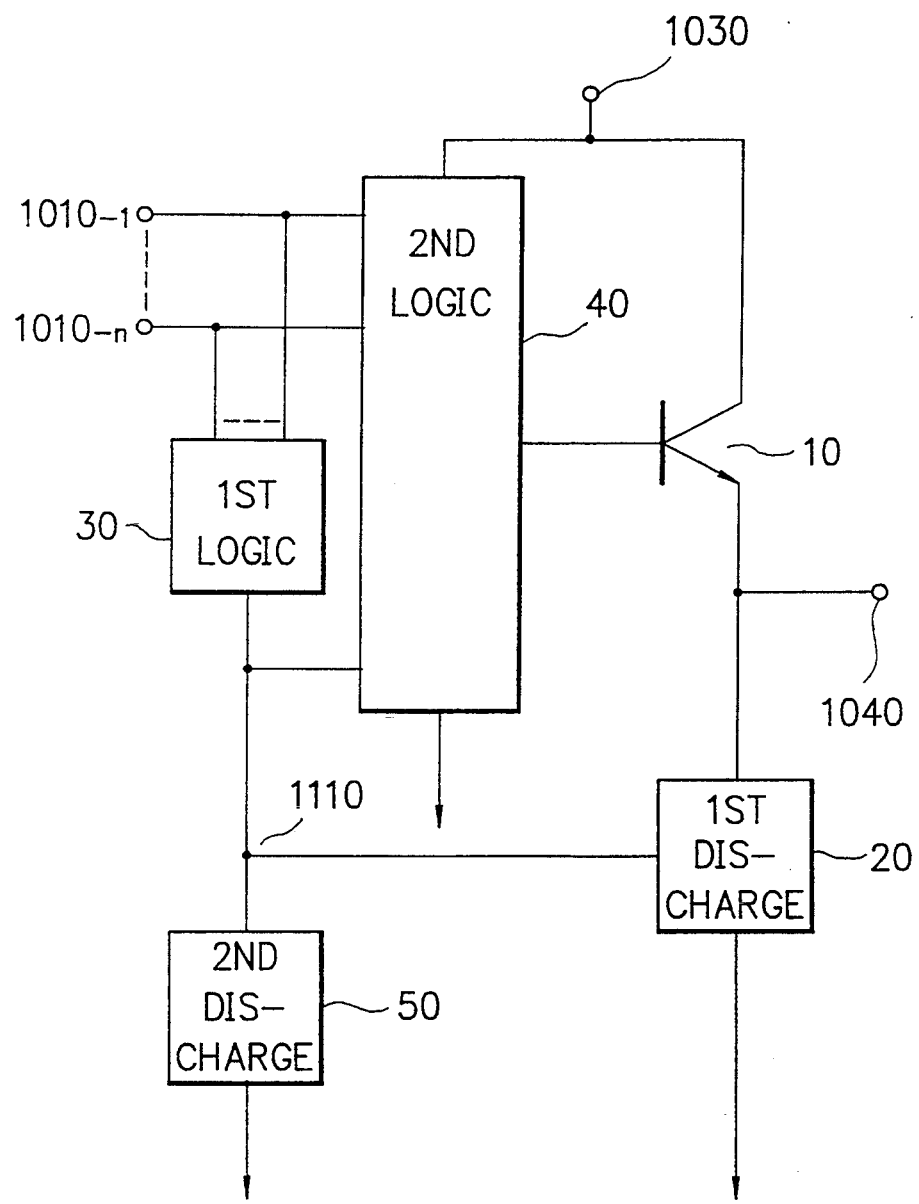
FIG. 2 is a block diagram of a first embodiment of a level converter circuit according to the present invention.

Referring now to the drawings, wherein like reference characters designate like or corresponding parts throughout the views and thus the repeated description thereof can be omitted for brevity, there is shown in FIG. 2 the first embodiment of a level converter circuit according to the present invention.

In this embodiment, as shown in FIG. 2, a collector and an emitter of a first bipolar transistor 10 are connected to a power source 1030 and an output terminal 1040, respectively, and a first charge discharge means 20 is connected between the output terminal 1040 and a reference voltage. A second logic circuit 40 is connected between the power source 1030 and the reference voltage. A plurality of input signals 1010-1 to 1010-n are input to a first logic circuit 30 and the second logic circuit 40. An output of the first logic circuit 30 is input to the second logic circuit 40 and the first charge discharge means 20 via a node 1110, and an output of the second logic circuit 40 is input to a base of the first bipolar transistor 10. A second charge discharge means 50 is connected between the first charge discharge means 20 via the node 1110 and the reference voltage.

Next, the operation of the level converter circuit described above will now be described.

In this embodiment, it is assumed as a prerequisite that, when the second logic circuit 40 has a NAND structure, the first logic circuit 30 has an OR structure, or, when the second logic circuit 40 has a NOR structure, the first logic circuit 30 has an AND structure. First, an operation of a case that the output of the second logic circuit 40 is switched from "0" to "1" level will be described. At this time, the first charge discharge means 20 is adapted to be off. Also, since the base voltage of the first bipolar transistor 10 is switched from "0" to "1" level, the first bipolar transistor 10 is switched on. As a result, the output terminal 1040 is switched from "0" to "1" level. Next, when the input signal is varied and the output of the second logic circuit 40 is switched from "1" to "0" level, the first bipolar transistor 10 turned off. On the other hand, the first charge discharge means 20 is turned on, and the output terminal 1040 is switched from "1" to "0" level. In this operation, since the amplitude of the input signals 1010-1 to 1010-n is small, a steady state current flows in the second logic circuit 40 and the first charge discharge means 20. This is controlled by the first logic circuit 30 so as to allow the steady state current to be almost zero and to perform the switching. A propagation delay time can be reduced by a time corresponding to the level converter circuits 4a and 4b of the conventional circuit. Further, since the input signals 1010-1 to 1010-n are a multi input logical type, logic gates to be connected to the outputs of the BiMIS driver circuits 5a and 5b of the conventional circuit can be taken in, and thus the propagation delay time can be further reduced.

Figure 3:
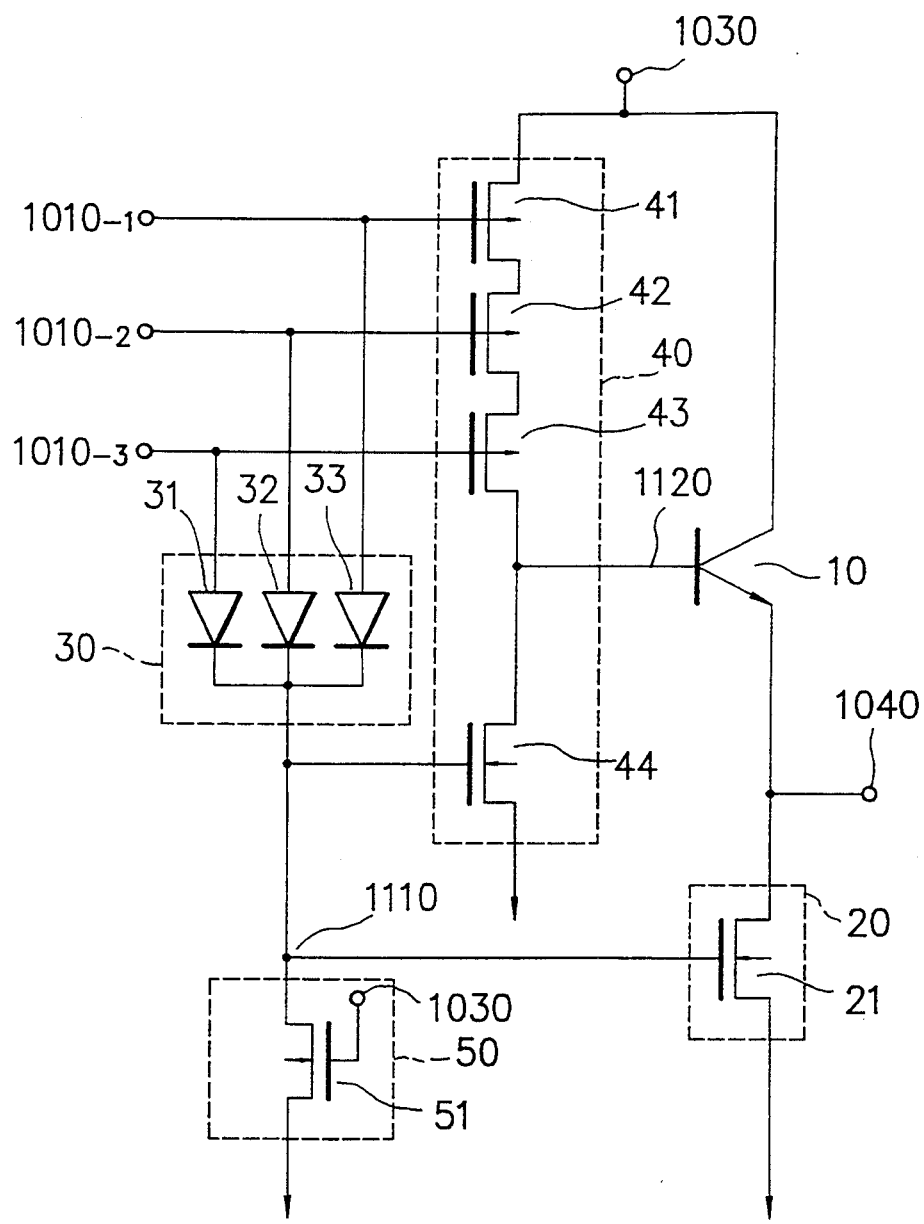
FIG. 3 is a circuit diagram of a second embodiment of a level converter circuit according to the present invention.

In FIG. 3, there is shown the second embodiment of a level converter circuit according to the present invention, which is a more specific embodiment of the first embodiment shown in FIG. 2.

In this case, the first charge discharge means 20 is a first MIS transistor 21 and the drain and the source of the first MIS transistor 21 are connected to the emitter of the first bipolar transistor 10 and the reference voltage, respectively. The first logic circuit 30 includes first, second and third diodes 31, 32 and 33 arranged in parallel. The input signals 1010-1, 1010-2 and 1010-3 are input to the first, second and third diodes 31, 32 and 33, respectively, and the outputs of the first, second and third diodes 31, 32 and 33 are input to the gate of the first MIS transistor 21 via the node 1110. The second logic circuit 40 includes second, third, fourth and fifth MIS transistors 41, 42, 43 and 44, connected in series from a source to a drain. Thus, the drain of the second MIS transistor 41 is connected to the power source 1030. The drain and the source of the third MIS transistor 42 are linked to the source of the second MIS transistor 41 and the drain of the fourth MIS transistor 43, respectively, and so forth. The input signals 1010-1, 1010-2 and 1010-3 are also input to the gates of the second, third and fourth MIS transistors 41, 42 and 43, respectively, and the outputs of the first, second and third diodes 31, 32 and 33 are input to the gate of the fifth MIS transistor 44. The source of the fourth MIS transistor 43 and the drain of the fifth MIS transistor 44 are connected to the base of the first bipolar transistor 10 via a node 1120. The source of the fifth MIS transistor 44 is coupled with the reference voltage. The second charge discharge means 50 is a sixth MIS transistor 51. The drain of the sixth MIS transistor 51 is connected to the gate of the first MIS transistor 21 via the node 1110, and the gate and the source of the sixth MIS transistor 51 are linked to the power source 1030 and the reference voltage, respectively.

Next, the operation of the level converter circuit described above will now be described.

Figure 1:
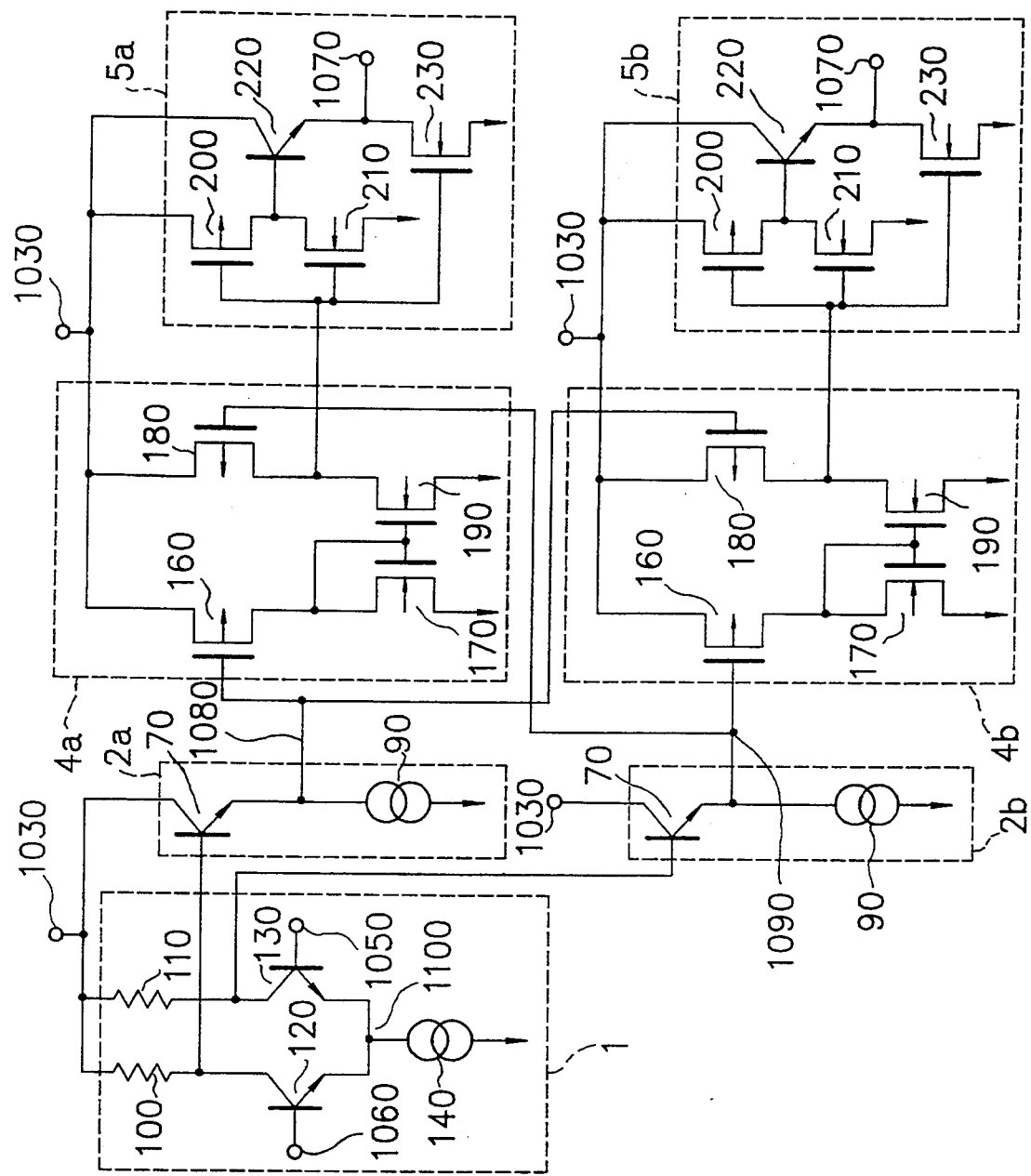
FIG. 1 is a circuit diagram of a conventional level converter circuit.

In this case, as described above with respect to the conventional circuit shown in FIG. 1, before the input of the level converter circuit shown in FIG. 3, the ECL circuit 1 and the emitter follower circuits 2a and 2b are required. In the ECL circuit 1, depending on the resistors 100 and 110 and a current value of a current source 140, an amplitude of an output voltage of the ECL circuit 1 can be determined at will. However, a certain extent of voltage is required between both the ends of the current source 140 due to its structural elements, and there is a lower limit of a voltage at a node 1100. Also, in order that the bipolar transistors 120 and 130 are not saturated at all, there should be a lower limit of the output voltage of the ECL circuit 1. Now, assuming that a power source voltage VEE (reference voltage) is determined to −4.5 V, the maximum amplitude of the output voltage of the ECL circuit 1 is approximately 2.0 V. The voltages of the outputs 1080 and 1090 of the emitter follower circuits 2a and 2b are −0.8 V to −2.8 V. Hence, as the input signals 1010-1, 1010-2 and 1010-3 in FIG. 2, −0.8 V to −2.8 V is determined.

When all the input signals 1010-1, 1010-2 and 1010-3 have a low level voltage (here, −2.8 V), through the three diodes 31, 32 and 33, the discharge of the charge is carried out by the sixth MIS transistor 51, and thus the voltage at the node 1110 is dropped to the off voltage (threshold value voltage) of the first MIS transistor 21 and the fifth MIS transistor 44. As a result, The first MIS transistor 21 and the fifth MIS transistor 44 are turned off. Also, the second, third and fourth MIS transistors 41, 42 and 43 are turned on, and the voltage at the node 1120 is raised to that of the power source 1030. As a result, the first bipolar transistor 10 is switched on, and the voltage at the output terminal 1040 is raised to that of the power source 1030. When the input signal 1010-1 has a high level voltage (here, −0.8 V), through the diode 33, the voltage at the node 1110 is raised until the first MIS transistor 21 and the fifth MIS transistor 44 are turned on. Also, the second MIS transistor 41 is turned off, and the voltage at the node 1120 is dropped to the reference voltage. As a result, the first bipolar transistor 10 is switched off, and the voltage at the output terminal 1040 is fallen to the reference voltage.

In the second embodiment, as described above, since the nodes 1110 and 1120 can be made to be the MIS or BiMIS level, the switching can be performed while the steady state current is made to be almost zero.

Figure 4:
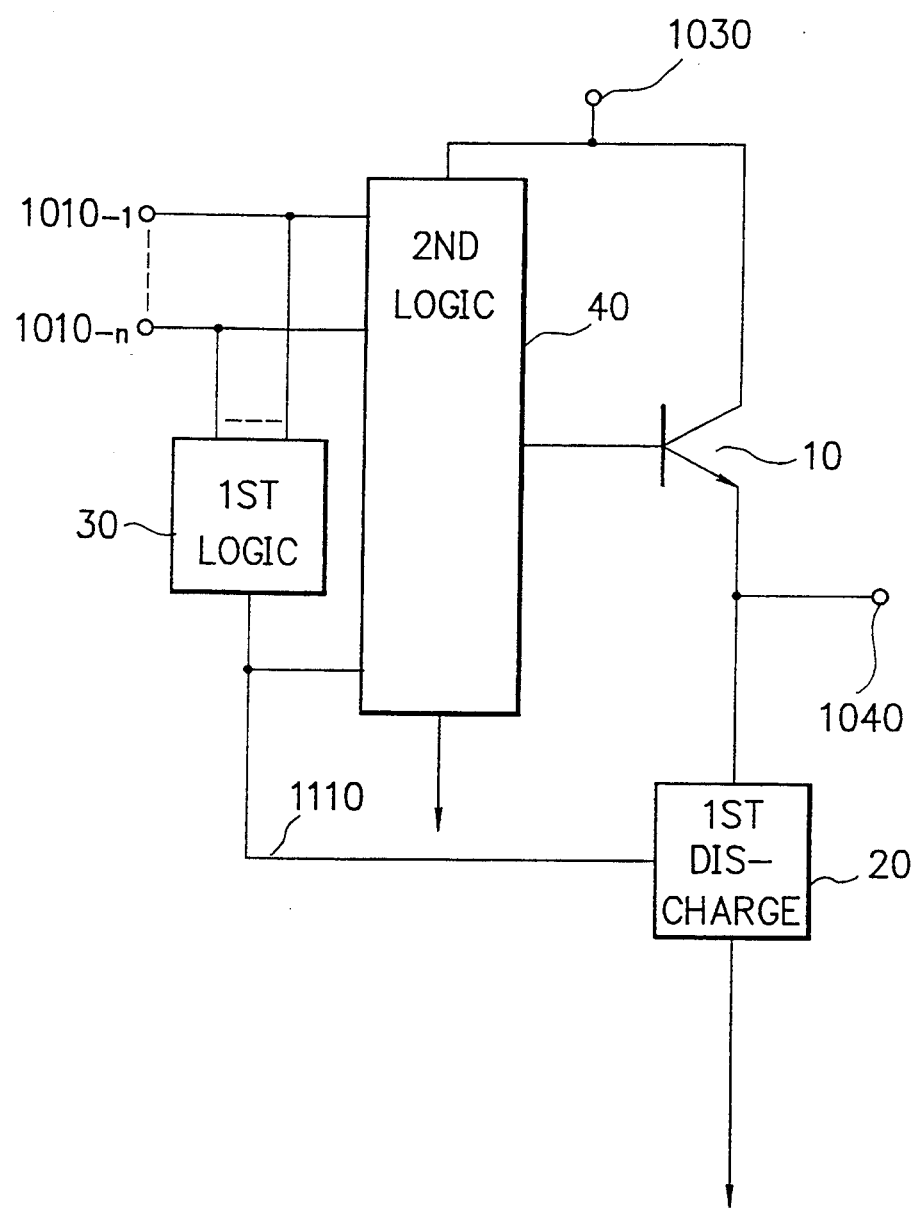
FIG. 4 is a block diagram of a third embodiment of a level converter circuit according to the present invention.

In FIG. 4, there is shown the third embodiment of a level converter circuit according to the present invention.

In this embodiment, the construction of the level converter circuit is the same as the first embodiment shown in FIG. 2, except that the second charge discharge means 50 is omitted, and thus the detailed description of this embodiment can be omitted for brevity.

Figure 5:
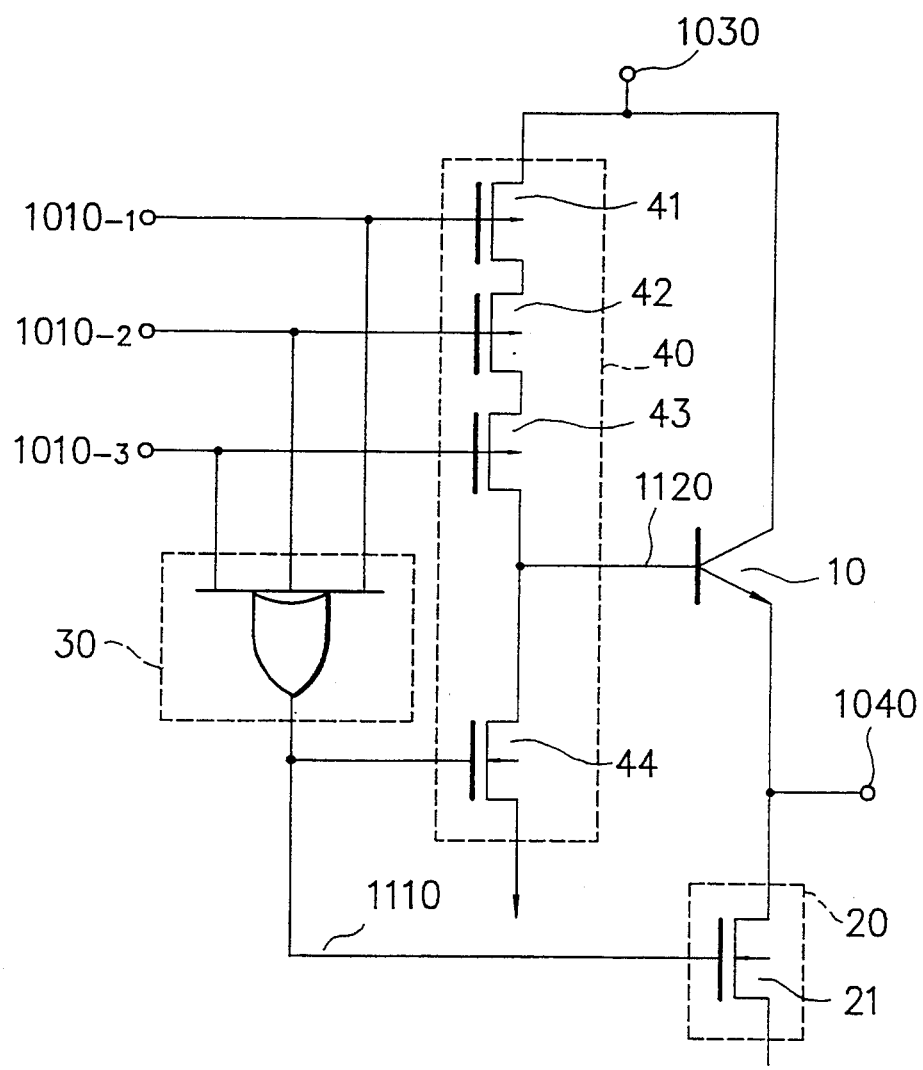
FIG. 5 is a circuit diagram of a fourth embodiment of a level converter circuit according to the present invention.

In FIG. 5, there is shown the fourth embodiment of a level converter circuit according to the present invention, which is a more specific embodiment of the third embodiment shown in FIG. 4.

In this embodiment, the level converter circuit has the same construction as the second embodiment shown in FIG. 3, except that the sixth MIS transistor 51 is omitted. Further, in this embodiment, the first logic circuit 30 is comprised of an OR logic to implement the level converter circuit. Thus, the detailed description of this embodiment can be omitted for brevity.

Figure 6:
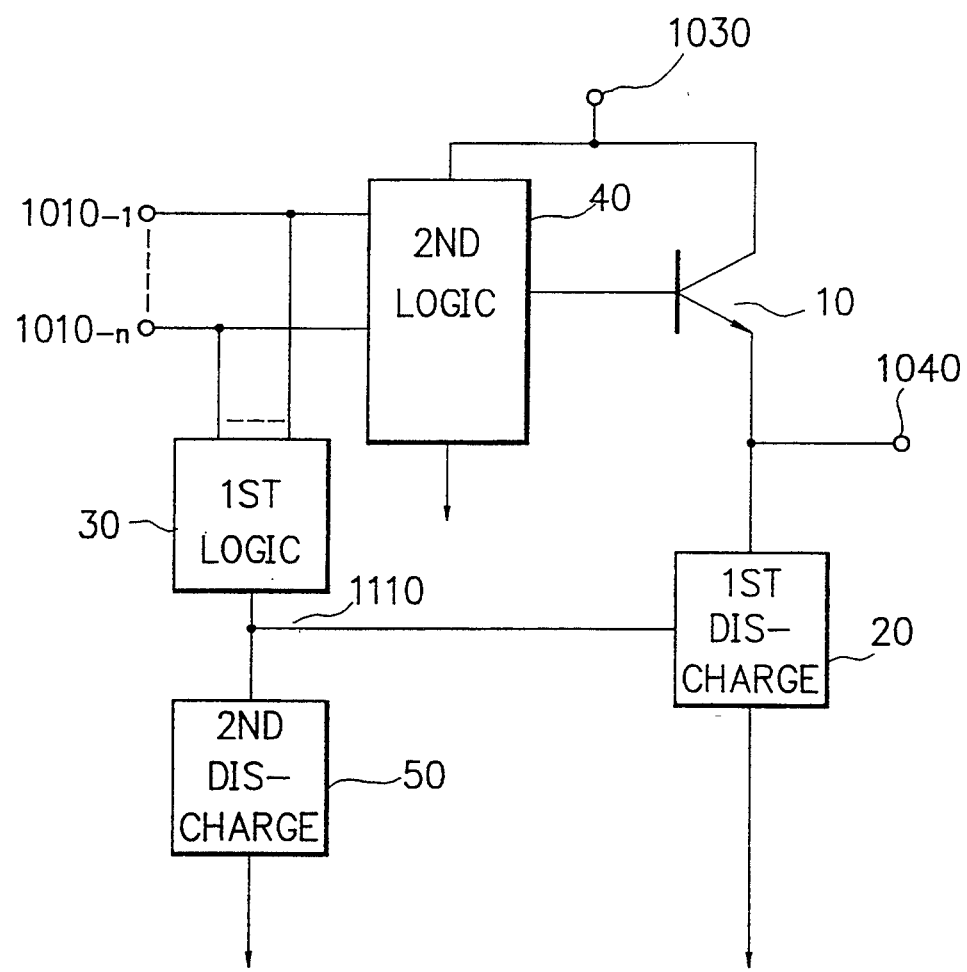
FIG. 6 is a block diagram of a fifth embodiment of a level converter circuit according to the present invention.

In FIG. 6, there is shown the fifth embodiment of a level converter circuit according to the present invention.

In this embodiment, the construction of the level converter circuit is the same as the first embodiment shown in FIG. 2, except that the output of the first logic circuit 30 is not input to the second logic circuit 40. This embodiment is functionally the same as the first embodiment, but, since no output of the first logic circuit 30 is input to the second logic circuit 40, the propagation delay time is faster than the first embodiment. Thus, the detailed description of this embodiment can be omitted for brevity.

In FIG. 7, there is shown the sixth embodiment of a level converter circuit according to the present invention, which is a more specific embodiment of the fifth embodiment shown in FIG. 6.

In this embodiment, the level converter circuit has the same construction as the second embodiment shown in FIG. 3, except that the output of the first logic circuit 30 is not input to the fifth MIS transistor 44 of the second logic circuit 40, and the second logic circuit 40 further includes a seventh MIS transistor 45 and an eighth MIS transistor 46. More specifically, the fifth, seventh and eighth MIS transistors 44, 45 and 46 are connected in parallel, that is, the drains and the sources of these transistors 44, 45 and 46 are connected to the base of the first bipolar transistor 10 and the reference voltage, respectively. Further, the input signals 1010-1, 1010-2 and 1010-3 are input to the gates of the fifth, seventh and eighth MIS transistors 44, 45 and 46, respectively. The operation of this embodiment is carried out in the same manner as the second embodiment shown in FIG. 3 and thus can be omitted for brevity.

Figure 8:
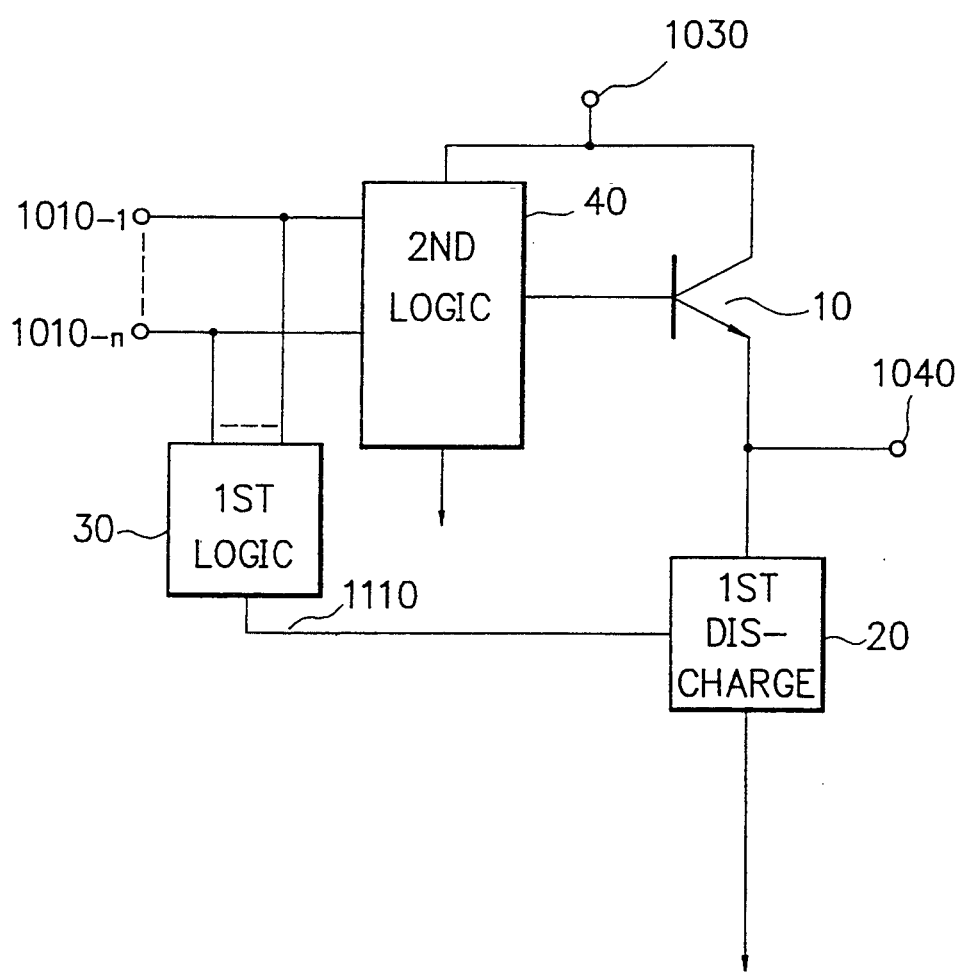
FIG. 8 is a block diagram of a seventh embodiment of a level converter circuit according to the present invention.

In FIG. 8, there is shown the seventh embodiment of a level converter circuit according to the present invention.

In this embodiment, the construction of the level converter circuit is the same as the fifth embodiment shown in FIG. 6, except that the second charge discharge means 50 is omitted, and thus the detailed description of this embodiment can be omitted for brevity.

Figure 9:
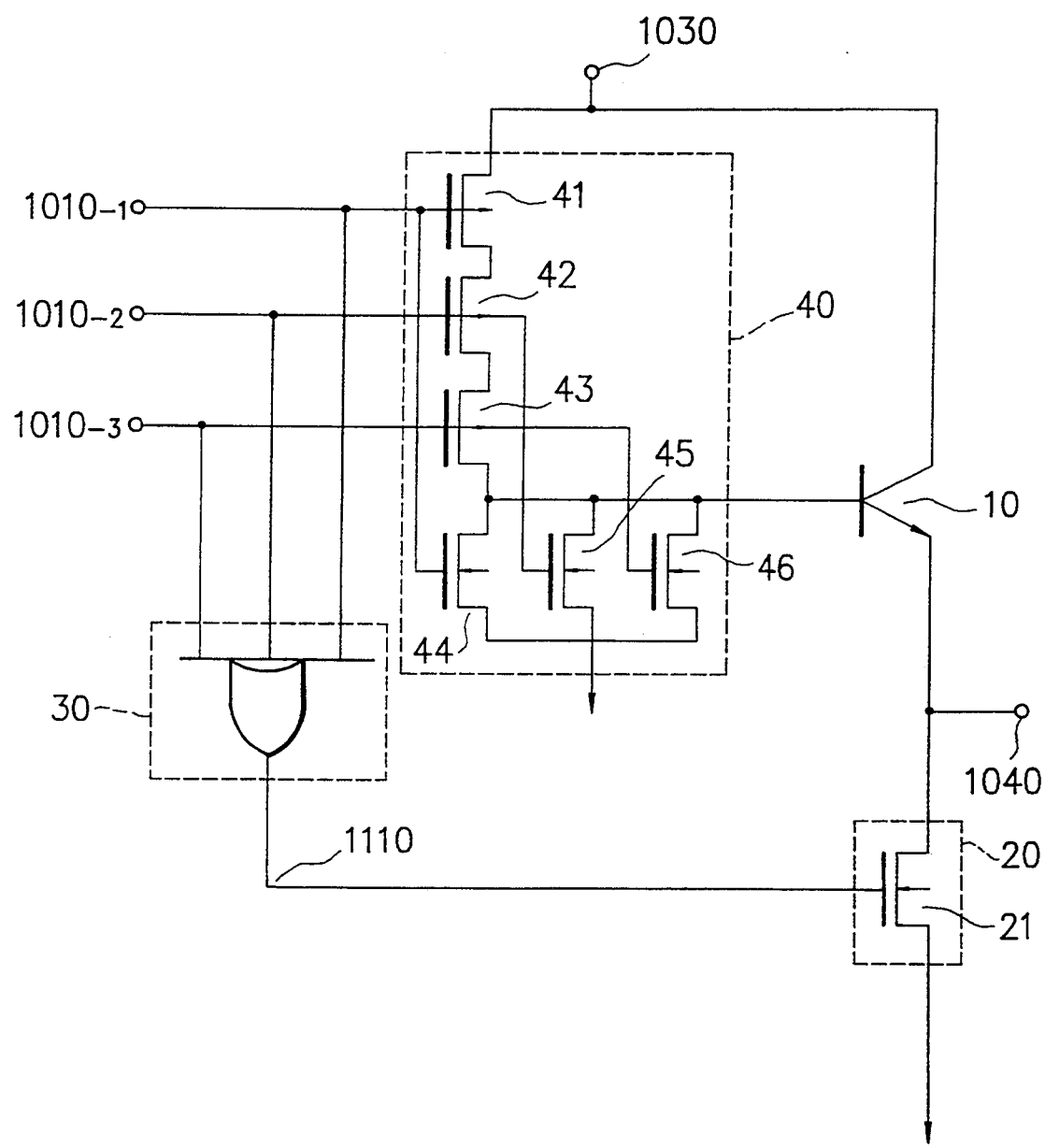
FIG. 9 is a circuit diagram of an eighth embodiment of a level converter circuit according to the present invention.

In FIG. 9, there is shown the eighth embodiment of a level converter circuit according to the present invention, which is a more specific embodiment of the seventh embodiment shown in FIG. 8.

In this embodiment, the level converter circuit has the same construction as the sixth embodiment shown in FIG. 7, except that the sixth MIS transistor 51 is omitted. Further, in this embodiment, the first logic circuit 30 is comprised of an OR logic to implement the level converter circuit. Thus, the detailed description of this embodiment can be omitted for brevity.

As described above, according to the present invention, since by adding a level conversion function or device to a conventional driver circuit, a conventional level converter circuit independently provided can be omitted, a propagation delay time can be reduced, and a dissipation current can be reduced. Further, since a logical level conversion is performed, a logic gate to be connected to an output of a conventional driver circuit can be taken in a level converter circuit according to the present invention, and thus the propagation delay time can be further reduced.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A level converter circuit for level converting an input signal having ECL levels into an output signal having logic levels differing from the ECL levels of the input signal, the level converter circuit comprising:
   a first bipolar transistor having a collector connected to a power source, an emitter connected to an output terminal, and a base;
   a first charge discharge means connected between the output terminal and a reference voltage and including an input terminal;
   a first logic circuit including at least one diode inputting at least one input signal having ECL levels and having an output terminal connected to the input terminal of the first charge discharge means; and
   a second logic circuit inputting the at least one input signal having ECL levels and having an output terminal connected to the base of the first bipolar transistor, wherein the first and second logic circuits generate a first state having the first bipolar transistor turned on and the first charge-level discharge means turned off and a second state having the first bipolar transistor turned off and the first charge-discharge means turned on, the first and second states being responsive to the at least one input signal.

2. The level converter circuit of claim 1 wherein the first logic circuit includes a plurality of diodes respectively inputting a plurality of input signals having ECL levels.

3. The level converter circuit of claim 2 wherein the second logic circuit inputs a plurality of second input signals having ECL levels.

4. A level converter circuit for level converting an input signal having ECL levels into an output signal having logic levels differing from the ECL levels of the input signal, the level converter circuit comprising:
 a first bipolar transistor having a collector connected to a power source, an emitter connected to an output terminal, and a base;
 a first MIS transistor connected between the output terminal and a reference voltage and including an input terminal;
 a first logic circuit including a plurality of diodes respectively inputting a plurality of input signals having ECL levels, the first logic circuit having an output terminal connected to the input terminal of the first MIS transistor; and
 a second logic circuit inputting the plurality of input signals having ECL levels and having an in input terminal connected to the output terminal of the first logic circuit and an output terminal connected to the base of the first bipolar transistor; and
 a second MIS transistor connected between the input terminal of the first MIS transistor and the reference voltage.

5. The level converter circuit of claim 4 wherein the second MIS transistor has an input connected to the power source.

6. The level converter circuit of claim 4 wherein the wherein the first and second logic circuits generate a first state having the first bipolar transistor turned on and the first MIS transistor turned off and a second state having the first bipolar transistor turned off and the first MIS transistor turned on, the first and second states being responsive to the plurality of input signals.

7. A level converter circuit for level converting an input signal having ECL levels into an output signal having logic levels differing from the ECL levels of the input signal, the level converter circuit comprising:
 a first bipolar transistor having a collector connected to a power source, an emitter connected to an output terminal, and a base;
 a first MIS transistor connected between the output terminal and a reference voltage and including an input terminal;
 a first logic circuit including a plurality of diodes respectively inputting a plurality of input signals having ECL levels, the first logic circuit having an output terminal connected to the input terminal of the first MIS transistor; and
 a second logic circuit inputting the plurality of input signals having ECL levels and having an output terminal connected to the base of the first bipolar transistor; and
 a second MIS transistor connected between the input terminal of the first MIS transistor and the reference voltage.

* * * * *

UNITED STATES PATENT AND TRADEMARK OFFICE
CERTIFICATE OF CORRECTION

PATENT NO. : 5,357,154
DATED : October 18, 1994
INVENTOR(S) : Takashi Oguri

It is certified that error appears in the above-indentified patent and that said Letters Patent is hereby corrected as shown below:

Column 6, line 63, change "charge-level discharge" to --charge-discharge--.

Signed and Sealed this

Twenty-fourth Day of January, 1995

Attest:

BRUCE LEHMAN

Attesting Officer

Commissioner of Patents and Trademarks